(12) United States Patent
Allott et al.

(10) Patent No.: US 8,717,081 B2
(45) Date of Patent: May 6, 2014

(54) NON-OVERLAPPING CLOCK GENERATOR

(75) Inventors: Stephen Allott, Scotts Valley, CA (US);
Thomas McKay, Boulder Creek, CA (US)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 13/493,114

(22) Filed: Jun. 11, 2012

(65) Prior Publication Data

US 2013/0328605 A1    Dec. 12, 2013

(51) Int. Cl.
*H03K 3/00* (2006.01)
*G06F 1/04* (2006.01)

(52) U.S. Cl.
USPC ............ 327/291; 327/259; 327/298; 327/299

(58) Field of Classification Search
USPC .......................... 327/231, 256–259, 291–299
See application file for complete search history.

(56) References Cited

U.S. PATENT DOCUMENTS 6,023,179 A *  2/2000  Klass ............................. 327/211
8,487,682 B2 *  7/2013  Du et al. ........................ 327/231

* cited by examiner

*Primary Examiner* — An Luu
(74) *Attorney, Agent, or Firm* — Edell, Shapiro & Finnan, LLC

(57) ABSTRACT

A non-overlapping clock generator including an enabling module and N pulse-generating modules connected as a ring is provided. When the ith input node has a high voltage level, the enabling module enables the ith pulse-generating module so as to trigger the ith pulse-generating module to discharge the ith input node. After the ith input node has been discharged to a low voltage level, the ith pulse-generating module charges the ith output node to the high voltage level.

16 Claims, 7 Drawing Sheets

NON-OVERLAPPING CLOCK GENERATOR

BACKGROUND OF THE INVENTION

1. Field of the Invention

The present invention relates to techniques for generating clock signals. In particular, the present invention relates to techniques for generating non-overlapping clocks.

2. Description of the Prior Art

Most integrated receivers used on cellular products today have to be able to achieve high levels of sensitivity in the presence of large close in and out of band blockers. This has historically required the use of high Q narrow band filters. The requirement has typically been met with a combination of surface acoustic wave (SAW) filters and high Q on-chip inductors to narrow band the receive chain. The disadvantage of a narrow band receive chain is that multiple front ends, which include the low noise amplifier (LNA), may be necessary to cover multiple cellular bands.

A translational filter capable of translating a low frequency response to higher frequencies can be used in receivers having to cover multiple cellular bands. The characteristics of a translational filter are defined in terms of in-band gain, Q and out-of-band rejection. A study has shown that these important characteristics are highly dependent on the duty cycle and non-overlapping characteristics of signals provided by the local oscillator (LO) for tuning the translational filter. Furthermore, it has been demonstrated that the translational filter has little to no effect on reciprocal mixing and as such the LO must have low phase noise at the reciprocal mixing offset frequencies.

SUMMARY OF THE INVENTION

To satisfy the aforementioned requirements, a new non-overlapping clock generator is provided. Plural pulse-generating modules are connected in series as a ring. The pulse widths with high voltage level in the signals generated at the output nodes of the pulse-generating modules do not have any overlap. Further, the signals generated by the non-overlapping clock generator have good performance in phase noise, and the duty cycles of the signals are adjustable. In practice, the non-overlapping clock generator according to the invention can be utilized not only in receivers including translational filters, but also other electronic systems requiring non-overlapping clocks.

One embodiment according to the invention is a non-overlapping clock generator including N pulse-generating modules connected in series and an enabling module. The ith pulse-generating module among the N pulse-generating modules has an ith input node, an ith enabling node, and an ith output node. N is an integer larger than 1; i is an integer index ranging from 1 to N. For i smaller than N, the ith output node is connected to the (i+1)th input node. The Nth output node is connected to the first input node. The enabling module is used for providing an ith enabling signal to the ith enabling node. The enabling module enables the ith pulse-generating module when the ith input node has a high voltage level, so as to trigger the ith pulse-generating module to discharge the ith input node. After the ith input node is discharged to a low voltage level, the ith pulse-generating module charges the ith output node to the high voltage level.

The advantage and spirit of the invention may be understood by the following recitations together with the appended drawings.

BRIEF DESCRIPTION OF THE APPENDED DRAWINGS

FIG. 1(A), FIG. 1(B), and FIG. 1(D) show exemplary pulse-generating modules according to the invention. FIG. 1(C) shows the timing diagram of the pulse-generating modules.

DETAILED DESCRIPTION OF THE INVENTION

Figure 1A:
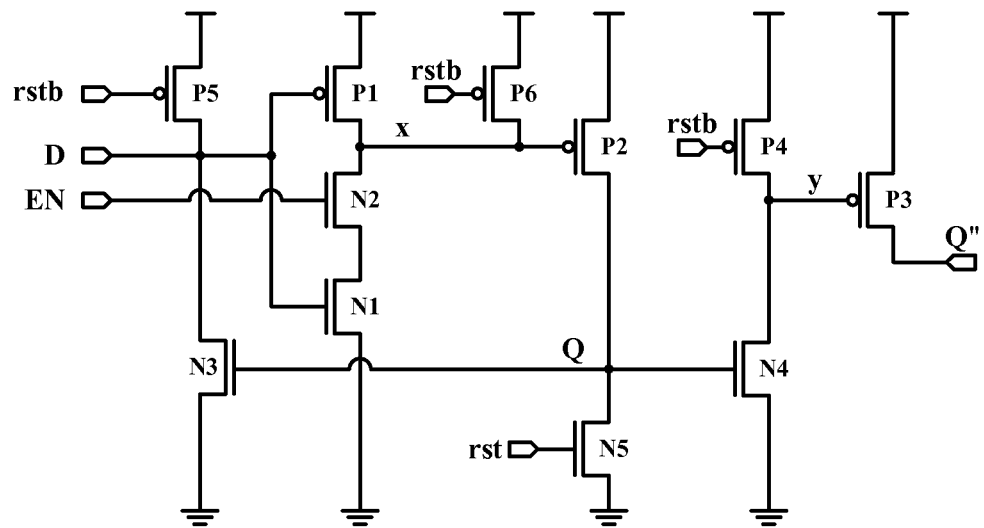
Figure 1B:
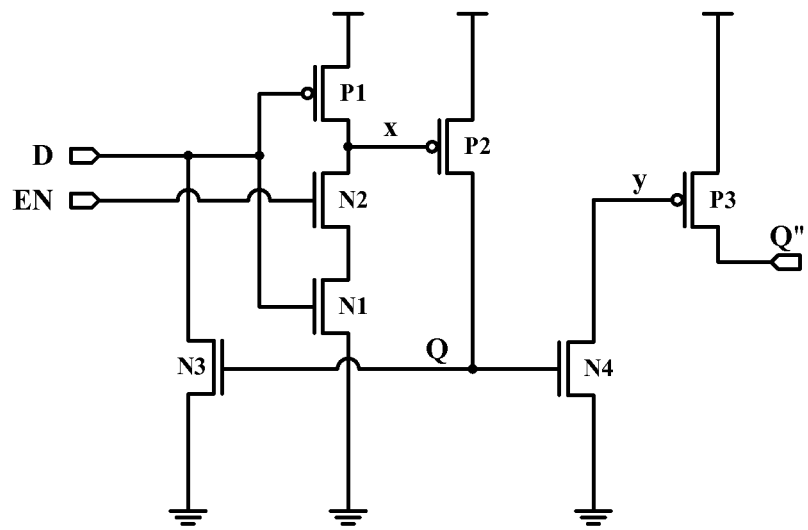

One embodiment according to the invention is a non-overlapping clock generator including plural pulse-generating modules. The operation of a single pulse-generating module is first introduced below. FIG. 1(A) illustrates a pulse-generating module as one embodiment of the present invention. This pulse-generating module includes NMOS transistors N1~N5 and PMOS transistors P1~P6. The transistors N5 and P4~P6 are used for resetting the pulse-generating module. In a reset status, the reset signal 'rst' is at a high voltage level, and the inverse reset signal 'rstb' has a low voltage level. In FIG. 1(B), the reset transistors N5 and P4~P6 are omitted.

Referring to FIG. 1(B), D is the input signal to transistor P1 and N1. EN is the enabling signal that feeds to N2 and is capable of enabling the circuit. An intermediate signal appears at Node Q is effected by the status of the transistors N3 and P2.

Figure 1C:
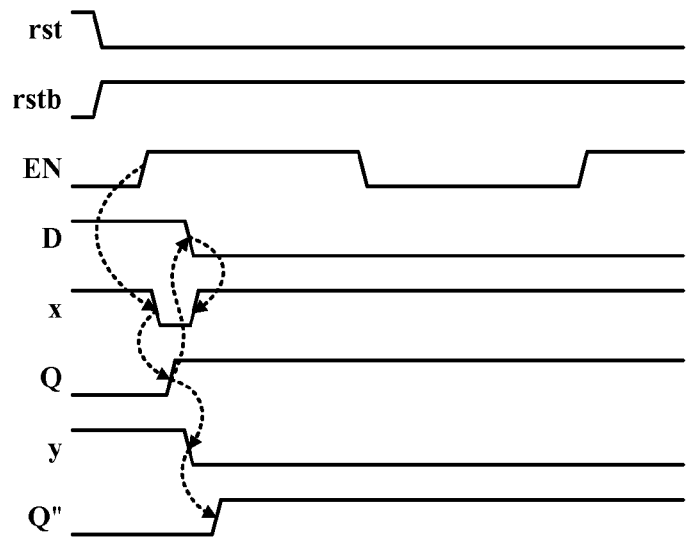

FIG. 1(C) shows the timing diagram of the circuit shown in FIG. 1(B). First, the input signal at input node D is at high voltage level, and the signal at intermediate node Q is at low voltage level. Once the enabling signal EN is switched from low to high (i.e. starting to enable the circuit), the transistors N1 and N2 are turned on so that they form a short circuit to the ground, which means that the node x is pulled down to the low voltage level (i.e., ground level). The transistor P2 is then turned on so that node Q is pulled up to the high voltage level. Subsequently, the transistor N3 is turned on when the voltage level at node Q is high enough. The input signal at node D is accordingly discharged, so the input signal is pulled down to the low voltage level. The pulled down input signal at node D then turns the transistor P1 on, and the node x is pulled back to the high voltage level. Besides the transistor N3, the increased voltage level at node Q also turns on the transistor N4; as a result, node y is pulled down to the low voltage level. The pulled down voltage level at node y turns the transistor P3 on and the output signal at the output node Q" is then charged by the transistor P3. Consequently, the output signal at output node Q" is pulled up to the high voltage level.

As shown in FIG. 1(C), the pulled up node Q respectively pulled down the input signal at input node D and the intermediate signal at node y. The pulling down of the node y further induces the pulling up of the output signal at output node Q". The transistors N4 and P3 act as delay units for delaying the voltage level switch at node Q resulted from input signal at input node D, and lead to a further switch delay of the output signal Q". More specifically, in the embodiment of the present invention, as long as the sizes of the transistors N3, N4, and P3 are properly designed, it is guaranteed that the rising edge of the output signal at output node Q" appears after the falling edge of the input signal at input node D. Provided that the parasitic capacitance at the node Q is large enough, no matter whether the enabling signal EN goes high or low thereafter, the output signal at output node Q" can be maintained at the high voltage level.

Figure 1D:
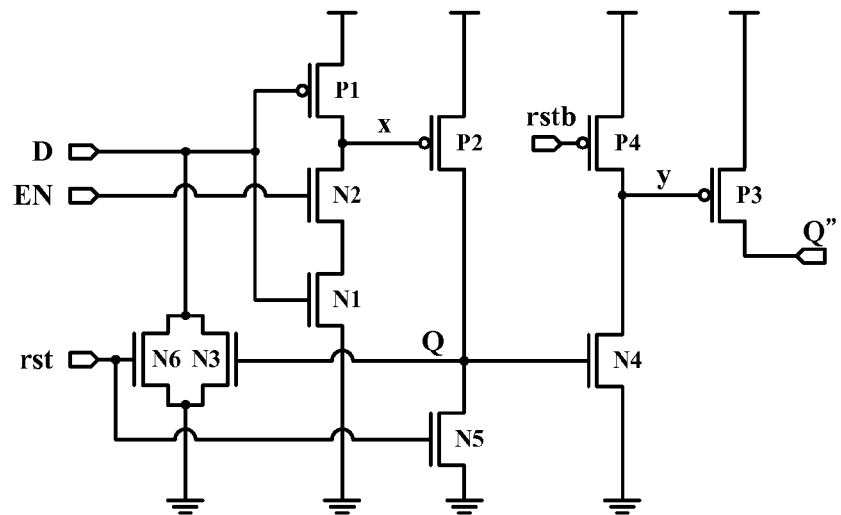

FIG. 1(D) illustrates the second embodiment of pulse-generating module. The transistors N1~N5 and P1~P4 in FIG. 1(D) are the same as the ones shown in FIG. 1(A). The reset transistors P5 and P6 in FIG. 1(A) are replaced by the reset transistor N6 in FIG. 1(D). In a reset status, the input signal at input node D and intermediate signal at node Q in this example are reset to the low voltage level, and the node y is reset to the high voltage level. The node x is also pulled to the high voltage level because the input signal at node D turns on the transistor P1. It is noted that, after the reset signal is released, the operations of the circuits in FIG. 1(D) and FIG. 1(A) are the same.

Figure 2A:
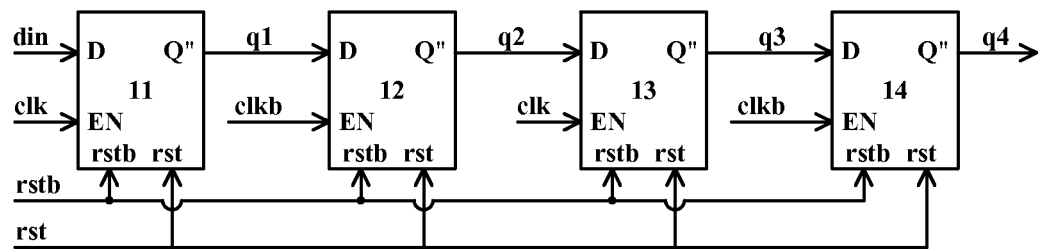
FIG. 2(A) shows the block diagram of the non-overlapping clock generator in one embodiment according to the invention.
Figure 2B:
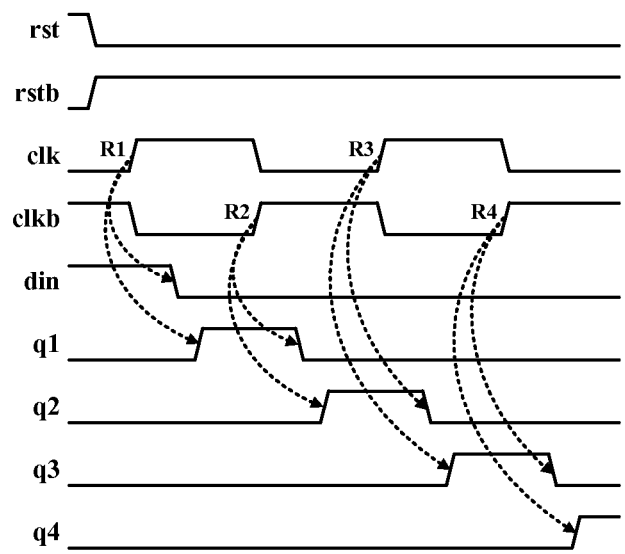
FIG. 2(B) shows the timing diagram of this non-overlapping clock generator.

FIG. 2(A) shows the block diagram of the non-overlapping clock generator in one embodiment according to the invention. The non-overlapping clock generator 200 includes four pulse-generating modules 11~14 connected in series. The inner circuit of the pulse-generating module 11 operates the same as the pulse-generating module shown in FIG. 1(A), and the respective inner circuit of the pulse-generating modules 12~14 operate the same as the one shown in FIG. 1(D). FIG. 2(B) is the timing diagram of the non-overlapping clock generator 200. The enabling signal for the pulse-generating modules 11 and 13 is the clock signal clk. The enabling signal for the pulse-generating modules 12 and 14 is the clock signal clkb. The clock signals clk and clkb are out of phase, and the duty cycles of the two signals are both substantially 50%. After being reset, the input signal din is reset to the high voltage level, and the signals q1~q3 are respectively reset to the low voltage level.

As described above, after the reset signal 'rst' and the inverse reset signal 'rstb' are released, once the rising edge R1 in the clock signal clk appears, the pulse-generating module 11 first pulls down the input signal din to the low voltage level. After the input signal din is pulled low, the output signal q1 is pulled up to the high voltage level. In view of the pulse-generating module 12, when the rising edge R2 in the enabling signal clkb appears, the input node D receives the input signal q1 that is at high voltage level. Accordingly, the pulse-generating module 12 first pulls the input signal q1 at node D down to the low voltage level and then output node Q" is pulled up to the high voltage level and it sends out a high voltage level output signal q2 subsequently. For the pulse-generating module 13, when the rising edge R3 appears in the enabling signal clk, the received input signal q2 at node D has the high voltage level. Therefore, the pulse-generating module 13 first pulls node D down to the low voltage level and then the output node Q" is pulled up to the high voltage level so it sends out a high voltage level signal q3. Similarly, for the pulse-generating module 14, when the rising edge R4 appears in the enabling signal clkb, the input signal q3 has the high voltage level. Hence, the pulse-generating module 14 first pulls the input signal q3 down to the low voltage level, and, as the output node Q" is subsequently pulled up, the output signal q4 is at high voltage level. As shown in FIG. 2(B), the high voltage segments in the input signal q1~q4 do not have any overlap.

Figure 3A:
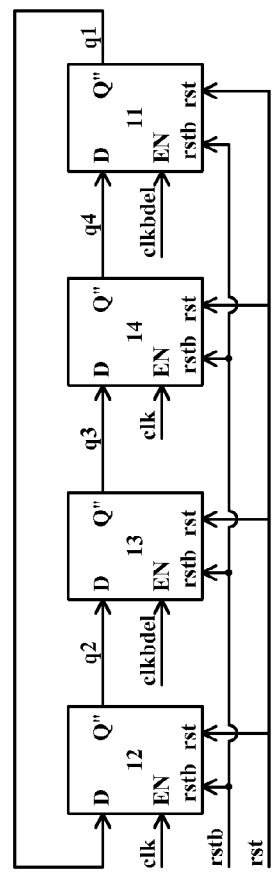
FIG. 3(A) shows the block diagram of the non-overlapping clock generator in another embodiment according to the invention.

FIG. 3(A) shows the block diagram of a non-overlapping clock generator in another embodiment according to the present invention. The connection of the pulse-generating modules and the phases of the enabling signals in the non-overlapping clock generators 300 are different from those in non-overlapping clock generators 200. In the non-overlapping clock generator 300 shown in FIG. 3(A), the pulse-generating modules 11~14 are connected as a ring, which means that the output signal q4 of the pulse-generating module 14 is fed into the input node D of the pulse-generating module 11. The pulse generating modules in this embodiment are based on the same configuration of the pulse generating modules previously described.

Figure 3B:
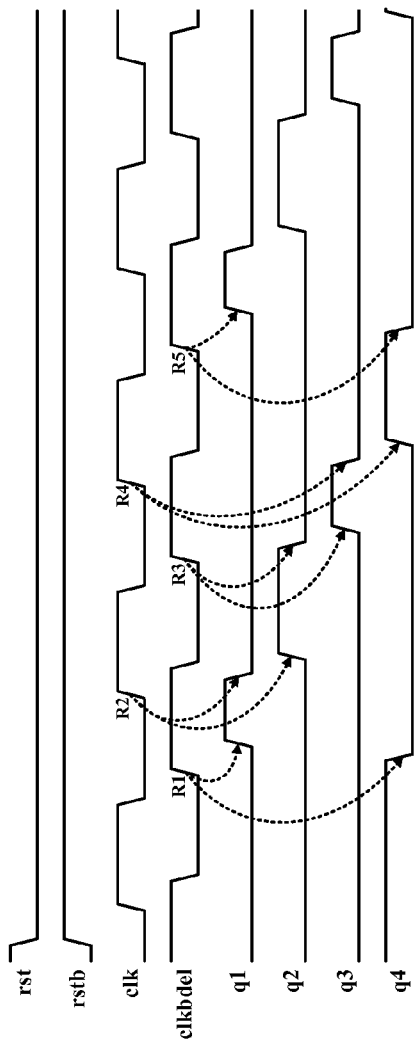
FIG. 3(B) shows the timing diagram of this non-overlapping clock generator.

FIG. 3(B) shows the timing diagram of the non-overlapping clock generator 300 in FIG. 3(A). In this embodiment, the enabling signal EN for the pulse-generating modules 11 and 13 is the clock signal 'clkbdel', and the enabling signal EN for the pulse-generating modules 12 and 14 is the clock signal 'clk'. In practice, the clock signal 'clkbdel' can be generated by delaying the inversed clock signal clk.

In a reset status, the signal q4 has the high voltage level, the signals q1~q3 have the low voltage level. As shown in FIG. 3(B), after the reset signal rst and the inverse reset signal rstb are released, once the rising edge R1 appears in the clock signal clkbdel, the pulse-generating module 11 is configured in a way that it first pulls its input signal q4 down to the low voltage level and then the output node Q" is pulled up to the high voltage level. For the pulse-generating module 12, when the rising edge R2 appears in the enabling signal clk, the received signal q1 from pulse-generating module 11 has the high voltage level. Accordingly, the pulse-generating module 12 pulls the node D down to the low voltage level before the output node Q" is pulled up to the high voltage level.

From above, for the pulse-generating module 13, when the rising edge R3 appears in the enabling signal clkbdel, the received signal q2 from pulse-generating module 12 has the high voltage level. Hence, the pulse-generating module 13 pulls the node D down to the low voltage level before the output node Q" is pulled up to the high voltage level. For the pulse-generating module 14, as it receives a high voltage level signal q3 from pulse generating module 13 when the rising edge R4 appears in the enabling signal clk, the pulse-generating module 14 pulls the node D down to the low voltage level and then the output node Q" is pulled high accordingly and subsequently pulse-generating module 14 outputs the high voltage level signal q4. The output signal q4 with high voltage level sent out by the pulse-generating module 14 will feedback to the pulse-generating module 11 and then the pulse-generating module 11 will pull the signal q4 low again when the rising edge R5 appears in the enabling signal clkbdel and then pull the signal q1 high again.

It can be seen that, in the non-overlapping clock generator 300, the pulse-generating modules 11~14 can operate recursively. That is, after the reset signal rst and the inverse reset signal rstb are released, the non-overlapping clock generator 300 can sustain its oscillation. The signals q1~q4 are periodical signals. However it is to be noted that, the inputs of the two adjacent pulse generating modules (e.g., signal q1 and signal q2) may have different duty cycles, i.e., different pulse widths. This is due to the fact that the every two adjacent pulse generating modules are respectively clocked at a clock and a delayed version of the reversed clock. Furthermore, as shown in FIG. 3(B), the pulse generating modules of the present invention are configured in a way that the output signal at the output node Q" continues independently from change of its input signal at input node D. The pulse widths (high voltage level) in the input signals q1~q4 do not overlap with one another. Based on different design choices, the circuit designer can select one or more signals among the signals q1~q4 as output signals of the non-overlapping clock generator 300.

One advantage of the non-overlapping clock generator of the present invention is that the phase noises of the signals q1~q4 are considerably low. As shown in FIG. 1(B), the high voltage level output signal at node Q″ is maintained by the parasitic capacitance at the node Q. Taking the signal q1 in and FIG. 1(B) and FIG. 3(A) as an example, when the transistor N3 in the pulse-generating module 12 pulls the signal q1 low to the low voltage level, the transistor N3 does not have to compete against a PMOS transistor. On the other side, when the transistor P3 in the pulse-generating module 11 pulls the signal q1 up to the high voltage level, the transistor P3 does not have to compete against an NMOS transistor to change the output node voltage, either. Hence, the transition time between high/low voltage levels for the signal q1 is quite short. In other words, the rising and falling edges of the signals q1~q4 in the present invention can be sharp, so the signals q1~q4 have good performance in phase noise.

In practice, the pulse-generating modules in FIG. 2(A) and FIG. 3(A) are not limited to the circuits shown in FIG. 1(A) and FIG. 1(D). For example, the circuit designer can change the transistor for receiving the enabling signal EN to a PMOS transistor and correspondingly inverse the enabling signal. For another example, the circuit for delaying the intermediate signal at node Q can further include plural inverters. The main requirement for a pulse-generating module in the non-overlapping clock generator according to the invention is properly pulling the output signal high after pulling the input signal low when being triggered.

As shown in FIG. 3(B), the rising and falling edges of the signals q1~q4 are triggered by the clock signals clk and clkbdel. Taking the first pulse in the signal q1 for example, signal q1's falling edge is triggered by the rising edge R2 in the clock signal clk, and signal q1's rising edge is resulted from the operation of the previous signal q4 triggered by the rising edge R1 of clock signal clkbdel. Upon design choices, one can adjust the duty cycles of the signals q1~q4 by changing the phase of the enabling signals (e.g. the clock signal clk or clkbdel). For instance, advancing the rising edge R1 in the clock signal clkbdel or postponing the rising edge R2 in the clock signal clk can widen the pulse width (i.e., the high voltage level duration) of the signal q1. In practice, the duty cycles of the enabling signals provided to the pulse-generating modules are not limited to 50%. The enabling signals are not limited to periodical signals, either.

Figure 4:
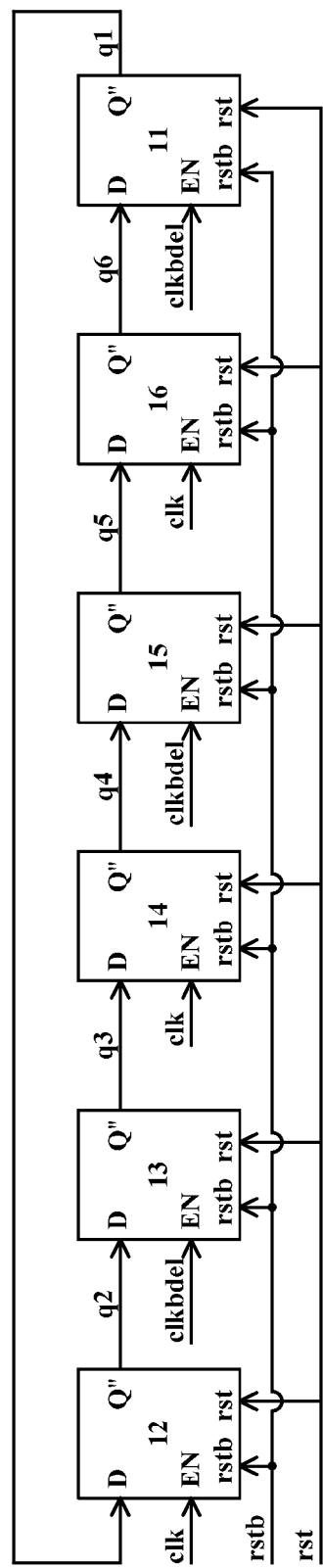
FIG. 4 illustrates an exemplary non-overlapping clock generator including six pulse-generating modules.

Furthermore, the number of pulse-generating modules in the non-overlapping clock generator according to the invention is not limited to four. For instance, the non-overlapping clock generator 300 can be modified to include six or eight pulse-generating modules. As shown in FIG. 4, connecting the pulse-generating modules as a ring can sequentially trigger the pulse-generating modules 11·16 round and round and generate six periodical signals q1~q6 that do not have any overlap in high voltage pulse width durations. In this example, the pulse-generating modules 11, 13, and 15 share the enabling signal clkbdel, and the pulse-generating modules 12, 14, and 16 share the enabling signal clk. The frequency of the signals q1~q6 is one third the frequency of the clock signal clk. In practice, the circuit designer can decide the number of pulse-generating modules and the frequency of the clock signal clk. One or more signals among the signals q1~q6 can be selected as output signals of this non-overlapping clock generator.

Figure 5A:
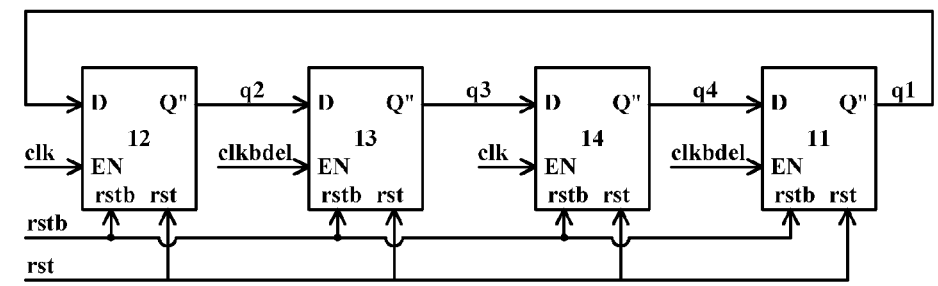
FIG. 5(A) shows the block diagram of the non-overlapping clock generator in another embodiment according to the invention.
Figure 5A:
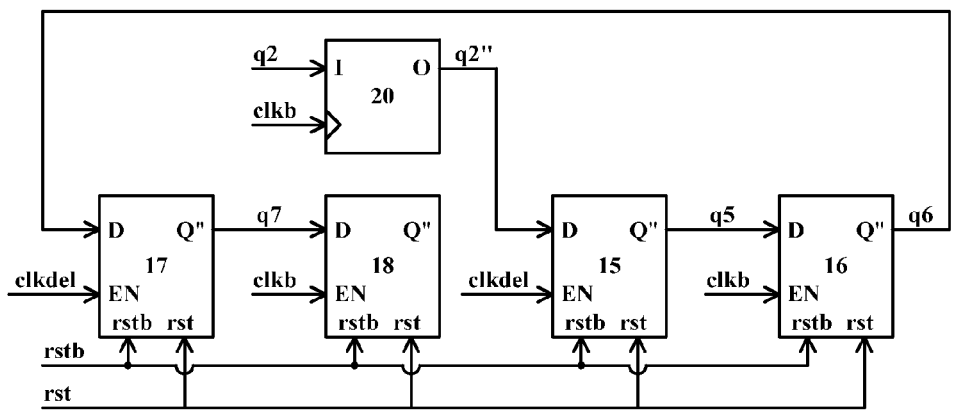
Figure 5A:
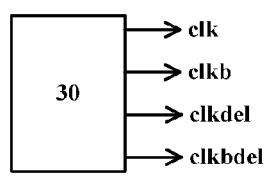

FIG. 5(A) shows the block diagram of a non-overlapping clock generator 500 in another embodiment according to the invention. The non-overlapping clock generator 500 includes two rings of four pulse-generating modules 11~14 (hereafter the first ring) and 15~18 (second ring), with a re-timing module 20 and an enabling module 30. In practice, the re-timing module 20 can be a latch. Each Circuitry of pulse-generating module 11~14 in the first ring is configured as the one shown in FIG. 1(B). The respective inner circuit of pulse-generating modules 15~18 is the one shown in FIG. 1(D). It is to be noted that, while the first ring oscillates autonomously and recursively, the second ring oscillates by operation of the first ring.

Figure 5B:
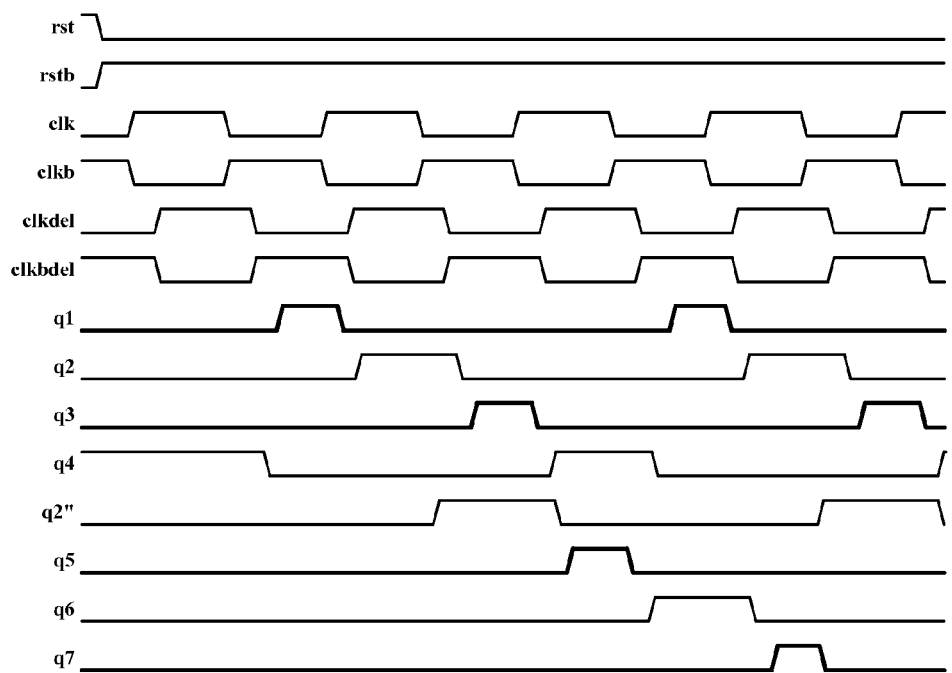
FIG. 5(B) shows the timing diagram of this non-overlapping clock generator.

The enabling module 30 is responsible for providing enabling signals to the pulse-generating modules 11~18. In this embodiment, the enabling module 30 generates four enabling signals, as shown in FIG. 5(B), with the same period but different phases: clk, clkb, clkdel, and clkbdel. In practice, the enabling module 30 can first generate the clock signal clk. Inversing the clock signal clk can generate the clock signal clkb. Delaying the clock signal clk can generate the clock signal clkdel. Delaying the clock signal clkb can generate the clock signal clkbdel. As shown in FIG. 5(A), the pulse-generating modules 11 and 13 share the enabling signal clkbdel, the pulse-generating modules 12 and 14 share the enabling signal clk, the pulse-generating modules 15 and 17 share the enabling signal clkdel, and the pulse-generating modules 16 and 18 share the enabling signal clkb. In a word, the first ring of pulse-generating modules 11~14 receive two of the enabling signals from the four enabling signals in a way that the two enabling signals have inversed amplitudes and different phases. Similarly, the second ring of pulse-generating modules 15~18 also receive two of the enabling signals from the rest of the enabling signals, and the two also have inversed amplitudes and different phases. The re-timing module 20 also receives the signal clkb as its clock signal.

The input node of the re-timing module 20 is connected to the output node of the pulse-generating module 12 for receiving the signal q2. The output signal q2″ of the re-timing module 20 is provided to the input node of the pulse-generating module 15. Re-timing module 20 operates according to the clock signal clkb, which re-times the rising edge of signal q2. In other words, by such configuration, the signal pulse q2 from the first ring is transferred across a clock domain via the re-timing module 20 to the second ring as a input signal, which guarantees non-overlapped and stable output signals.

To be more specific, when the enabling signal of the pulse-generating module 15 changes from low to high, the signal q2″ received by the pulse-generating module 15 can be guaranteed to have the high voltage level. After being triggered by the signal q2″, the pulse-generating module 15 pulls the signal q2″ down to the low voltage level; as a result, the output signal q5 is pulled up to the high voltage level. Similarly, the pulse-generating modules 16~18 will be sequentially triggered and generate the signals q6 and q7 shown in FIG. 5(B).

For example, one can select the four signals q1, q3, q5, and q7 as the output signals of the non-overlapping clock generator 500. As shown in FIG. 5(B), the duty cycles of the signals q1, q3, q5, and q7 are all lower than 25%, and the pulse widths (high voltage level duration) of the four signals do not have any overlap. The non-overlapping clock generator 500 also has the aforementioned advantage of low phase noise. Moreover, as shown in FIG. 5(A), the numbers of pulse-generating modules respectively corresponding to the four clock signals clk, clkb, clkdel, and clkbdel are substantially the same. The loadings at the output nodes of the pulse-generating modules are also substantially equal. This type of structure can provide output signals with similar characteristics.

As described above, a new non-overlapping clock generator is provided. The high-level segments in the signals generated at the output nodes of the pulse-generating modules are non-overlapping. The signals generated by the non-overlapping clock generator according to the invention have good performance in phase noise, and the duty cycles of the signals are adjustable. In practice, the non-overlapping clock generator according to the invention can be applied not only in receivers including translational filters, but also other electronic systems requiring non-overlapping clocks.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A non-overlapping clock generator, comprising:
a first set of N pulse-generating modules connected in series, each of the N pulse-generating modules having an input node, an enabling node, and an output node, N being an integer larger than 1, the input node of one pulse-generating module coupled to the output node of another pulse-generating module among the pulse-generating modules;
an enabling module for providing enabling signals to the respective enabling nodes;
wherein, for each pulse-generating module, when an input signal at the input node is at a high voltage level, the enabling module triggers, after a delay caused by at least one semiconductor switch, the input signal at the input node to turn to a low voltage level, so that an output signal at the output node is pulled to the high voltage level accordingly; and
a reset module for resetting one of the input nodes to the high voltage level and resetting the other input nodes to the low voltage level.

2. The non-overlapping clock generator of claim 1, wherein N is an even number, the enabling module provides a first enabling signal to the odd-number ones of the pulse-generating modules, and provides a second enabling signal to the even-number ones of the pulse-generating modules, wherein a phase of the first enabling signal is different from a phase of the second enabling signal.

3. The non-overlapping clock generator of claim 2, wherein duty cycles of both of the first enabling signal and the second enabling signal are substantially 50%.

4. The non-overlapping clock generator of claim 2, wherein the first enabling signal is inversed in amplitude from the second enabling signal.

5. The non-overlapping clock generator of claim 1, wherein the enabling module is configured to adjust a duty cycle of the output signal generated at the output node of one of the pulse-generating modules by changing a phase of the enabling signal or a phase of the other enabling signal of an adjacent pulse-generating module.

6. The non-overlapping clock generator of claim 1, wherein one or more output signals among the output signals generated at the output nodes are selected as output signals of the non-overlapping clock generator.

7. A non-overlapping clock generator, comprising:
a first set of N pulse-generating modules connected in series, each of the N pulse-generating modules having an input node, an enabling node, and an output node, N being an integer larger than 1, the input node of one pulse-generating module coupled to the output node of another pulse-generating module among the pulse-generating modules; and
an enabling module for providing enabling signals to the respective enabling nodes;
wherein, for each pulse-generating module, when an input signal at the input node is at a high voltage level, the enabling module triggers, after a delay caused by at least one semiconductor switch, the input signal at the input node to turn to a low voltage level, so that an output signal at the output node is pulled to the high voltage level accordingly,
wherein at least one pulse-generating module comprises:
a first NMOS transistor, having a gate connected to the input node, and a source connected to a ground end;
a first PMOS transistor, having a gate connected to the input node, a source connected to a power supply end, and a drain connected to a first intermediate node;
a second NMOS transistor, having a gate connected to the enabling node, a source connected to the drain of the first NMOS transistor, and a drain connected to the first intermediate node;
a second PMOS transistor having a gate connected to the first intermediate node, a source connected to the power supply end, and a drain connected to a second intermediate node;
a third NMOS transistor, having a gate connected to the second intermediate node, a source connected to the ground end, and a drain connected to the input node;
a fourth NMOS transistor, having a gate connected to the second intermediate node, a source connected to the ground end, and a drain connected to a third intermediate node; and
a third PMOS transistor, having a gate connected to the third intermediate node, a source connected to the power supply end, and a drain the output node.

8. The non-overlapping clock generator of claim 7, wherein the at least one pulse-generating module further comprises:
a fifth NMOS transistor, having a gate used for receiving a reset signal, a source connected to the ground end, and a drain connected to the second intermediate node, wherein when the reset signal is at the high voltage level, the pulse-generating module is reset;
a fourth PMOS transistor, having a gate o used for receiving an inverse reset signal, a source connected to the power supply end, and a drain connected to the third intermediate node, wherein when the inverse reset signal is at the low voltage level, the pulse-generating module is reset;
a fifth PMOS transistor, having a gate used for receiving the inverse reset signal, a source connected to the power supply end, and a drain connected to the input node; and
a sixth PMOS transistor, having a gate used for receiving the inverse reset signal, a source connected to the power supply end, and a connected to the first intermediate node.

9. The non-overlapping clock generator of claim 7, wherein the pulse-generating module further comprises:
a fourth PMOS transistor, having a gate used for receiving an inverse reset signal, a source connected to the power supply end, and a drain connected to the third intermediate node, wherein when the inverse reset signal is at the low voltage level, the pulse-generating module is reset;
a fifth NMOS transistor, having a gate used for receiving a reset signal, a source connected to the ground end, and a drain connected to the second intermediate node, wherein when the reset signal has the high voltage level, the pulse-generating module is reset; and a sixth NMOS transistor, having a gate used for receiving the reset signal, a source connected to the ground end, and a drain connected to the input node.

10. A non-overlapping clock generator, comprising:

a first set of N pulse-generating modules connected in series, each of the N pulse-generating modules having an input node, an enabling node, and an output node, N being an integer larger than 1, the input node of one pulse-generating module coupled to the output node of another pulse-generating module among the pulse-generating modules;

an enabling module for providing enabling signals to the respective enabling nodes;

wherein, for each pulse-generating module, when an input signal at the input node is at a high voltage level, the enabling module triggers, after a delay caused by at least one semiconductor switch, the input signal at the input node to turn to a low voltage level, so that an output signal at the output node is pulled to the high voltage level accordingly; and a re-timing module, comprising:
a re-timing input node, configured to receive the output signal from one of the first set of the pulse generating modules when the output signal is at a high voltage level;
a re-timing output node; and
a re-timing clock node, configured to receive a re-timing clock signal for delaying the high voltage level output signal received from the pulse generating module.

11. The non-overlapping clock generator of claim 10, further comprising:

a second set of N pulse-generating modules, each having an input node, a enabling node, and a output node, one of the input nodes of the second set of the pulse-generating modules connected to the re-timing output node, N−1 ones of the input nodes of the second set of the pulse-generating modules respectively connected to the output nodes of the other ones of the second set of the pulse-generating modules;

wherein when receiving an enabling signal, the enabling module enables an input signal of one of the second set of the pulse-generating modules to turn from the high voltage level to the low voltage level which allows an output signal at the output node of the same pulse-generating module to be pulled to the high voltage level.

12. The non-overlapping clock generator of claim 11, wherein the enabling module provides a first set of enabling signals to the first set of pulse-generating modules and provides a second set of enabling signals to the second set of pulse-generating modules, one enabling signal in the first set of enabling signals is delayed and inversed from at least the other one of the enabling signals in the same set, and one enabling signals in the second set of enabling signals is delayed and inversed from at least the other one of the enabling signals in the same set.

13. The non-overlapping clock generator of claim 11, wherein the enabling module provides a first enabling signal, a second enabling signal that is delayed from the first enabling signal, a third enabling signal that is inversed from the first enabling signal, and a fourth enabling signal that is delayed from the third enabling signal, the first set of the pulse-generating modules and the second set of the pulse-generating modules respectively receive two of the first, second, third and fourth enabling signals in a way that the two enabling signals have inversed amplitudes and different phases.

14. The non-overlapping clock generator of claim 13, wherein a number of the output signals generated at the output nodes of the pulse-generating modules are selected as output signals of the non-overlapping clock generator.

15. The non-overlapping clock generator of claim 10, further comprising a reset module for resetting one of the input nodes to the high voltage level and resetting the other input nodes to the low voltage level.

16. The non-overlapping clock generator of claim 10, wherein the re-timing module is a latch.

* * * * *